(12) United States Patent
Jacobs et al.

(10) Patent No.: US 6,977,215 B2
(45) Date of Patent: Dec. 20, 2005

(54) TUNGSTEN PLUG CORROSION PREVENTION METHOD USING GAS SPARGED WATER

(75) Inventors: John W. Jacobs, Granite Bay, CA (US); Elizabeth A. Dauch, Rocklin, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 47 days.

(21) Appl. No.: 10/695,285

(22) Filed: Oct. 28, 2003

(65) Prior Publication Data

US 2005/0090101 A1   Apr. 28, 2005

(51) Int. Cl.$^7$ .......................................... H01L 21/4763
(52) U.S. Cl. ...................................................... 438/622
(58) Field of Search ................................ 438/597, 618, 438/621, 622, 637, 672, 706, 720, 476; 134/1.3

(56) References Cited

U.S. PATENT DOCUMENTS

| | | | |
|---|---|---|---|
| 5,336,371 A * | 8/1994 | Chung et al. ................... 134/34 |
| 6,077,762 A | 6/2000 | Liang et al. ..................... 438/593 |
| 6,153,531 A | 11/2000 | Bothra et al. .................... 438/745 |
| 6,277,742 B1 * | 8/2001 | Wang et al. ..................... 438/672 |
| 6,284,055 B1 * | 9/2001 | Dryer et al. ..................... 134/10 |
| 6,358,329 B1 * | 3/2002 | Muranaka et al. ............. 134/26 |
| 6,410,417 B1 * | 6/2002 | Tsai et al. ....................... 438/618 |
| 6,851,873 B2 * | 2/2005 | Muraoka et al. .............. 396/611 |
| 2002/0036001 A1 * | 3/2002 | Ise .................................. 134/1.3 |
| 2002/0053355 A1 * | 5/2002 | Kamikawa et al. ............ 134/30 |
| 2003/0006513 A1 * | 1/2003 | Gotoh et al. ................... 261/122.1 |

OTHER PUBLICATIONS

Bothra, S., H. Sur and V. Liang, "A New Failure Mechanism by Corrosion of Tungsten in a Tungsten Plug Process," Technology Development, VLSI Technology, Inc., San Jose, California, 95131; 1998 IEEE.

* cited by examiner

Primary Examiner—Laura M. Schillinger
Assistant Examiner—Jennifer M Dolan
(74) Attorney, Agent, or Firm—Campbell Stephenson Ascolese LLP

(57) ABSTRACT

Disclosed herein is a method of making integrated circuits. In one embodiment the method includes forming tungsten plugs in a integrated circuit and forming electrically conductive interconnect lines after formation of the tungsten plugs, wherein at least one tungsten plug is electrically connected to at least one electrically conductive interconnect line. Separate from the formation of the tungsten plugs and electrically conductive interconnect lines, a gas is introduced into a liquid. At least one electrically conductive interconnect line is then contacted with the gas introduced liquid.

14 Claims, 4 Drawing Sheets

TUNGSTEN PLUG CORROSION PREVENTION METHOD USING GAS SPARGED WATER

BACKGROUND OF THE INVENTION

Interconnect lines electrically connect devices within an integrated circuit (IC). ICs may include one or more complimentary metal oxide semiconductor (CMOS) transistors having diffused source and drain regions separated by channel regions, and gates that are located over the channel regions. In practice, an IC may include thousands or millions of devices, such as CMOS transistors.

Interconnect lines of ICs generally take the form of patterned metallization layers. Interconnect lines may be formed one on top of another with an electrically insulating material therebetween. As will be more fully described below, one interconnect line may be formed under another interconnect line and electrically connected thereto by one or more tungsten plugs.

ICs are manufactured on silicon substrates, often called wafers, using conventional photolithographic techniques. FIGS. 1–8 show a cross-sectional view of an IC during a portion of its manufacture. More particularly, FIG. 1 shows a first dielectric layer 12, a first metallization layer 14, and a photoresist layer 16 formed over substrate 10. Layers 12–16 are formed using conventional techniques such as chemical vapor deposition, sputtering, or spin-on coating.

First metallization layer 14 can be formed into a first interconnect line. This first interconnect line can be formed by selectively exposing photoresist layer 16 to light passing through a patterned reticle (not shown). Photoresist areas of layer 16 exposed to light are subsequently removed using conventional development techniques. FIG. 2 shows the substrate 10 of FIG. 1 after development of photoresist layer 16 to form photoresist mask pattern 20.

Once the photoresist mask pattern 20 is formed, a plasma etching operation is applied to the IC shown in FIG. 2 to remove portions of metallization layer 14 that are not covered by photoresist mask pattern 20. FIG. 3 shows the IC of FIG. 2 after plasma etching thereof. The plasma etching operation results in first interconnect line 22.

FIG. 4 shows the IC of FIG. 3 after a second dielectric layer 24 is deposited thereon. Although not shown, photoresist mask pattern 20 is removed prior to formation of second dielectric layer 24. The second dielectric layer 24 and the first dielectric layer 12 may be formed from an insulating material such as silicon dioxide.

FIG. 5 shows the IC of FIG. 4 after a via 26 is formed within the second dielectric layer 24. As is well known in the art, vias, such as via 26, are formed by depositing a photoresist layer (not shown) over dielectric layer 24, selectively exposing this photoresist layer to light passing through a patterned reticle having via hole patterns formed therein, developing and removing the exposed photoresist to form a photoresist via mask pattern, etching any dielectric layer 24 exposed through the photoresist via mask pattern, and removing the remaining photoresist via mask after etching dielectric layer 24.

Once the vias are formed within the second dielectric layer 24, the vias are filled with an electrically conductive material such as tungsten. As well is known in the art, vias, such as via 26, are filled by depositing a barrier film by sputter or chemical vapor deposition, depositing a conductive film by sputter or chemical vapor deposition, and then removing the conductive film, and possibly removing the barrier film, over dielectric layer 24, but not inside the via 26. The barrier film is typically comprised of titanium, titanium nitride, or a titanium/titanium nitride stack. The conductive film is typically tungsten. The conductive film, and possibly the barrier film, is removed by plasma etching, chemical mechanical polishing, or wet etching. FIG. 6 shows via 26 of FIG. 5 filled with tungsten, thereby forming tungsten plug 30.

After the tungsten plugs are formed, a second metallization layer is formed over dielectric layer 24 and the tungsten plugs, including tungsten plug 30. This metallization layer is typically comprised of a metal stack that includes any combination of one or more the following: titanium, titanium nitride, aluminum, an aluminum copper alloy, or an aluminum silicon copper alloy. This metallization layer is then patterned using conventional photolithography and plasma etching to form an additional layer of interconnect lines. FIG. 7 shows the IC of FIG. 6 with a second interconnect line 32 formed thereon. The second interconnect line 32 is electrically coupled to the first interconnect line 22 via the tungsten plug 30. First interconnect line 22 may be coupled at one end to a first device (i.e., a first CMOS transistor). The second interconnect line 32 may be coupled to a second device (i.e., a second CMOS transistor) or coupled to connections which lead to the outside of the chip package. Accordingly, the structure of the first interconnect line 22, tungsten plug 30, and second interconnect line 32, function to interconnect the first and second IC devices or function to interconnect an IC device and external package connections.

As is well known in the art, conventional plasma etching to form interconnect lines (e.g., interconnect line 32) often leaves residual polymer (not shown) on the sides of the interconnect lines. To remove this residual polymer on the sides of the interconnect lines, a liquid cleaning solution is often used after plasma etch. Further, conventional plasma etching to form interconnect line 32 may leave a positive electrical charge on interconnect line 32, and thus, tungsten plug 30 and first interconnect line 22. For purposes of explanation, it will be presumed that the structure consisting of first interconnect line 22, tungsten plug 30, and second interconnect line 32 is a floating structure such that both interconnect lines 22 and 32 and tungsten plug 30 will be positively charged before the polymer residue removal process.

After plasma etching, the IC shown in FIG. 7 is exposed to a cleaning solution to remove any polymer remaining after the plasma etching step. Typically this cleaning solution may be alkaline or basic in nature (i.e. pH is greater than 7), however, acidic solutions (i.e. pH is less than 7) can also be used. Although the cleaning solution works well in removing polymer residues, one, some, or all of the tungsten plugs that are exposed to the cleaning solution may dissolve or erode away during the polymer residue removal process. The cause is electrochemical corrosion caused by two dissimilar conductive materials being in contact, the interconnect line and the tungsten plug, while both conductive materials are simultaneously in contact with an electrolyte, the cleaning solution or rinsing solution, during the polymer removal process.

More and more devices are packed into smaller ICs. As such, the density of devices and interconnect lines in ICs has dramatically increased over the years. Unfortunately, this dense integration of devices and interconnect lines has the effect of pushing the limits of conventional photolithography patterning, which necessarily makes photolithography masks misalignments more likely to occur. An increase in misalignments will result in an increase of exposed tungsten plugs.

FIG. 7 illustrates the effects of misalignment of photolithography masks. More particularly, the misalignment of photolithography masks used to create second interconnect line 32 produces a misalignment of second interconnect line 32 with respect to tungsten plug 30. As a result of this misalignment, tungsten plug 30 will be exposed to cleaning solution during the polymer residue removal step described above.

FIG. 8 illustrates how tungsten plug 30 could be corroded by the cleaning or rinsing solution of the polymer residue removal process. As seen in FIG. 8, a substantial portion of tungsten plug 30, is removed by the aforementioned corrosion. Tungsten plug corrosion may have adverse effects on performance of the IC. For example, corrosion of tungsten plug 30 shown in FIG. 8 may be so extensive that first interconnect line 22 is no longer electrically coupled to second interconnect line 32 thereby creating an open circuit therebetween. IC devices coupled to second interconnect line 32 could be electrically isolated from IC devices coupled to first interconnect line 22 thereby resulting in an IC that fails to function for its intended purpose.

Clearly, there is a need to avoid tungsten plug corrosion in the manufacture of ICs. In 1998, a paper was published by S. Bothra, H. Sur, and V. Liang, entitled, "A New Failure Mechanism by Corrosion of Tungsten in a Tungsten Plug Process," IEEE Annual International Reliability Physics Symposium, pages 150–156. This paper, which is incorporated herein by reference in its entirety, describes some techniques for preventing tungsten plug corrosion. These techniques involve discharging the tungsten plugs prior to immersion in alkaline cleaning solution to remove polymer residue. In one technique described in the paper, tungsten plug discharge is accomplished by dipping ICs in an ionic solution prior to polymer residue removal. The paper describes that this ionic solution should have a pH near neutral (e.g. pH near 7). The paper describes deionized (DI) water as one form of ionic solution for discharging tungsten plugs. However, the paper found that a relatively long emersion time of several hours within the DI water was necessary to discharge exposed tungsten plugs, such as the exposed tungsten plug shown in FIG. 7. The exposed tungsten plugs were found to remain in tact after subsequent emersion in the alkaline cleaning solution; however, noticeable corrosion of the interconnect lines, such as interconnect line 32, was observed. Accordingly, this paper concluded that emersion in DI water of ICs for the purpose of discharging exposed tungsten plugs, was not a "practical" approach. It is noted that this paper should not be considered prior art to the invention claimed herein.

U.S. Pat. No. 6,277,742 describes another technique for preventing tungsten plug corrosion. In U.S. Pat. No. 6,277, 742, an IC is dipped into an electrolyte solution sufficiently acid or alkaline. According to U.S. Pat. No. 6,277,742, charges accumulated can be discharged by dipping the IC into the electrolyte solution. Preferably, when an acid electrolyte solution is used, the pH value of the acid electrolyte solution is said to be less than 6.5. The acid electrolyte solution is said to include an oxy-acid aqueous solution such as acetic acid ($CH_3COOH$), sulfiric acid ($H_2SO_4$) or nitric acid ($HNO_3$). The acid electrolytic solution is said to include a hydrohalic acid like hydrofluoric acid (HF) or hydrochloric acid (HCl). An acid salt aqueous solution, for example, sodium hydrogen sulfate ($NaHSO_4$), ammonium chloride ($NH_4Cl$) or ammonium nitride ($NH_4NO_3$) is also said to be suitable. Preferably, when an alkaline electrolyte solution is used, the pH value of the alkaline electrolyte solution is greater than 7.5. The alkaline electrolyte solution is said to include either ammonium hydroxide ($NH_4OH$) aqueous solution or metal hydroxide ($M(OH)_x$) aqueous solution. The metal hydroxide aqueous solution includes sodium hydroxide (NaOH) or potassium hydroxide (KOH). An alkaline salt aqueous solution, for example, sodium acetate ($CH_3COONa$) or sodium carbonate ($Na_2CO_3$) is also said to be suitable. It is noted alkaline or acidic electrolytic solution may be environmentally hazardous or hazardous to those who are responsible for discharging ICs prior to polymer residue removal.

SUMMARY OF THE INVENTION

Disclosed herein is a method of making integrated circuits. In one embodiment the method includes forming tungsten plugs in a integrated circuit and forming electrically conductive interconnect lines after formation of the tungsten plugs, wherein at least one tungsten plug is electrically connected to at least one electrically conductive interconnect line. Separate from the formation of the tungsten plugs and electrically conductive interconnect lines, a gas is introduced into a liquid. At least one electrically conductive interconnect line is then contacted with the gas introduced liquid.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

Figure 1:
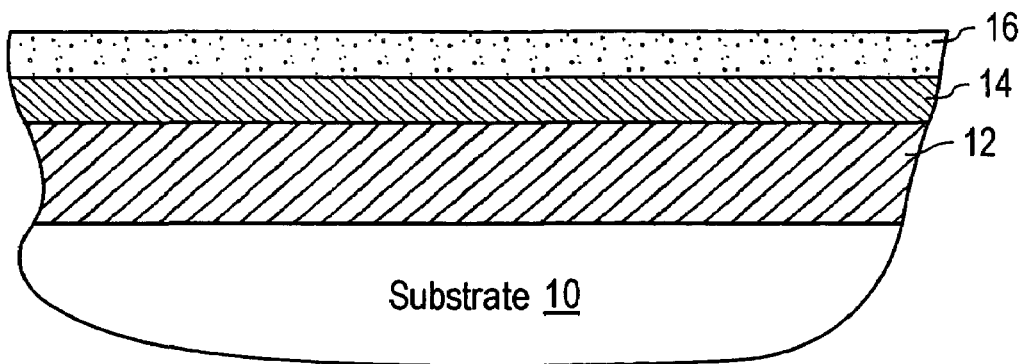
FIG. 1 is a cross-sectional view of a portion of a partially fabricated integrated circuit.
Figure 2:
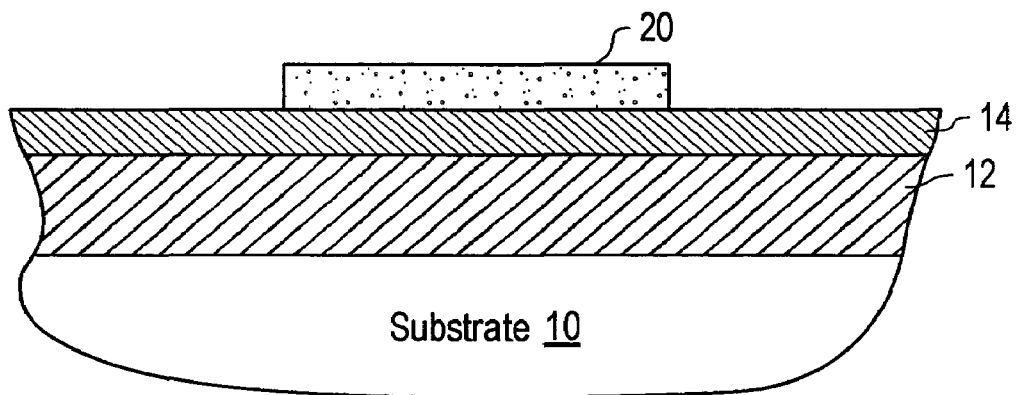
FIG. 2 shows the IC of FIG. 1 after patterning the photoresist layer to form photoresist mask pattern.
Figure 3:
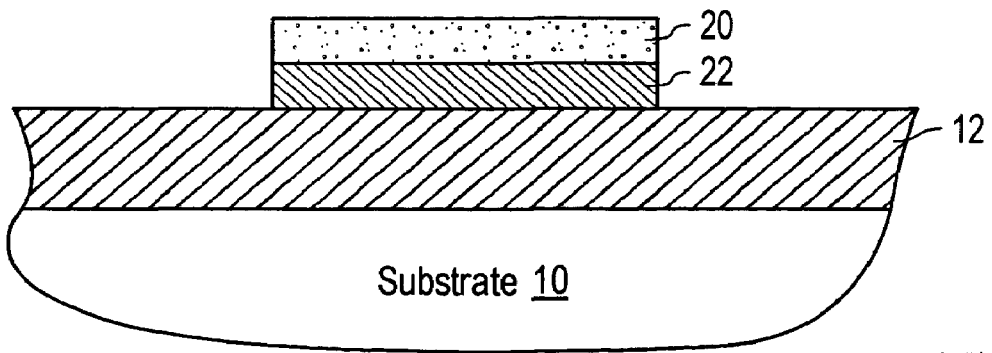
FIG. 3 shows the IC of FIG. 2 after etching the first metallization layer.
Figure 4:
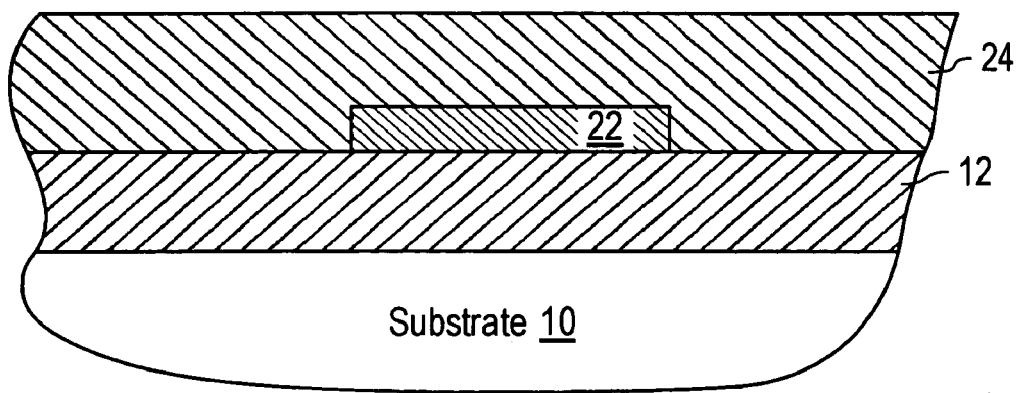
FIG. 4 illustrates the IC of FIG. 3 with a second dielectric layer formed thereon.
Figure 5:
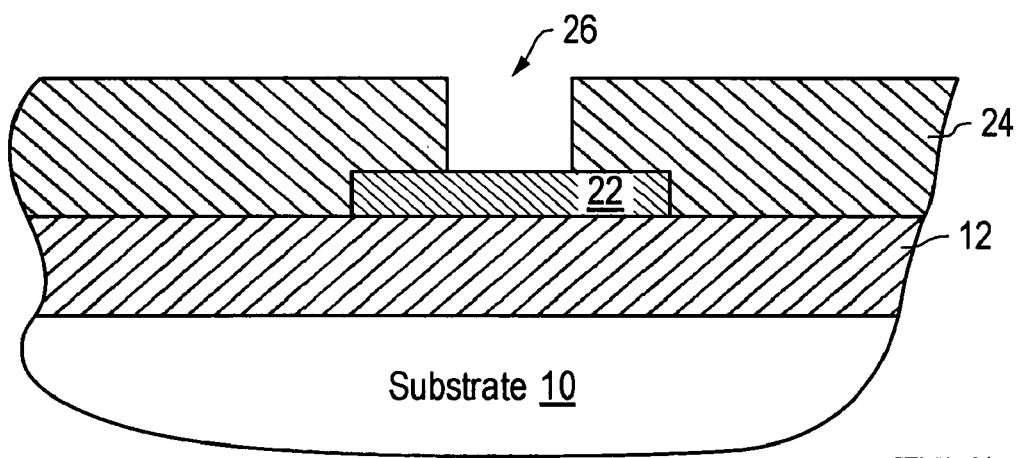
FIG. 5 illustrates the IC of FIG. 4 after formation of a via within the second dielectric layer.
Figure 6:
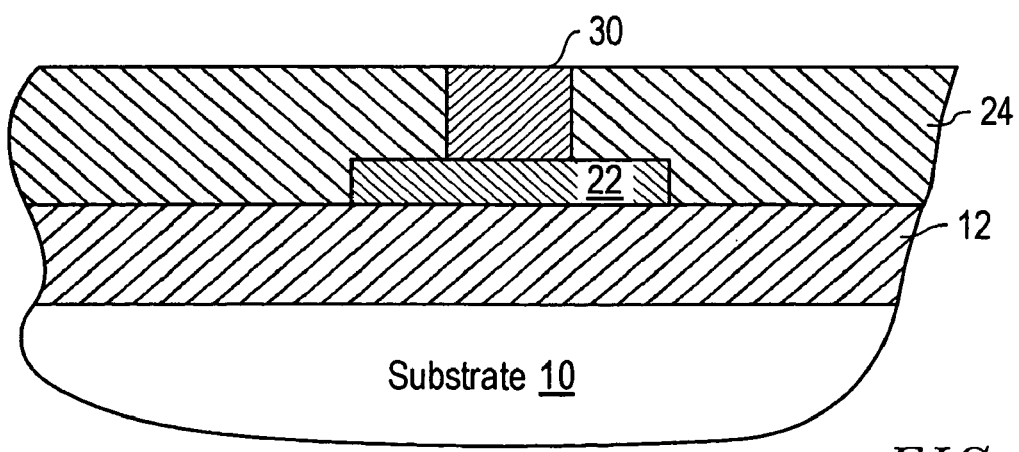
FIG. 6 shows the IC of FIG. 5 with a tungsten plug formed therein.
Figure 7:
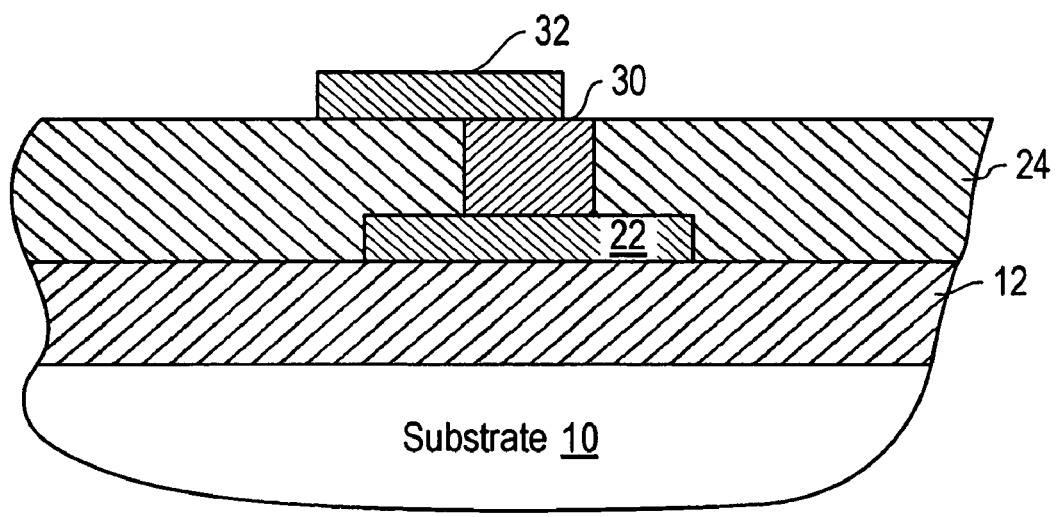
FIG. 7 shows the IC of FIG. 6 after formation of a second interconnect line thereon.
Figure 8:
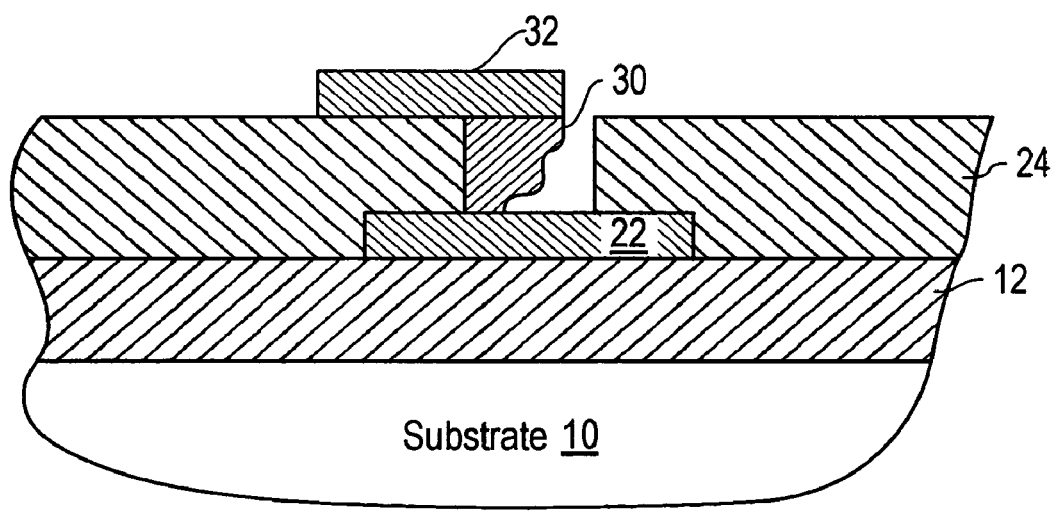
FIG. 8 shows the IC of FIG. 7 after exposure to a cleaning solution to remove polymer residue.

The present invention relates to a method of making ICs. In one embodiment the method includes forming a tungsten plug in a dielectric layer and forming an electrically conductive interconnect line partially or completely covering the tungsten plug after formation of the tungsten plug. FIG. 7 illustrates an exemplary, partially formed IC in which interconnect line 32 is formed after formation of dielectric layer 24 and tungsten plug 30. The electrically conductive interconnect line 32 in FIG. 7, may be formed from conductive materials such as a metal stack comprised of any combination of one or more of the following: titanium, titanium nitride, aluminum, an aluminum copper alloy, or an aluminum silicon copper alloy. The tungsten plug 30 is electrically connected to conductive interconnect line 32. The tungsten plug 30 in FIG. 7 may have a metal barrier film surrounding it (between the dielectric layer 24 and the tungsten plug 30). This metal barrier film may be formed from conductive materials such as a metal stack comprised of any combination of one or more of the following: titanium, titanium nitride, titanium tungsten, or tungsten nitride.

Formation of conductive line 32 may result in an unwanted polymer residue as described above. Moreover, formation of conductive line 32 may result in the accumulation of electrical charge on the conductive line 32 and the tungsten plug 30 connected thereto and the underlying conductive line 22 connected to tungsten plug 30. The polymer residue may be removed by a step of exposing the partially formed IC of FIG. 7 to a cleaning solution. Before the polymer residue removal step, conductive line 32 and the tungsten plug 30 connected thereto and the underlying conductive line 22 connected to tungsten plug 30 can be electrically discharged in order to avoid corrosion of tungsten plug 30 during residual polymer removal, as described above.

The conductive interconnect line 32 and the tungsten plug 30 connected thereto and the underlying conductive line 22 connected to tungsten plug 30 can be fully or partially discharged by contacting interconnect line 32 connected to tungsten plug 30 (and tungsten plug 30 if not covered by interconnect 32) with a liquid having a pH above or below neutral (i.e, pH 7). One method to create a liquid having a pH above or below neutral is to introduce gas into the liquid. In one embodiment, contact between interconnect line 32 connected to tungsten plug 30 (and tungsten plug 30 if not covered by interconnect 32) and a gas introduced liquid can occur by dipping the wafer containing the partially formed IC with interconnect line 32 and tungsten plug 30 into a bath of gas introduced liquid. In another embodiment, the gas introduced liquid is sprayed onto the surface of the wafer containing the partially formed IC with interconnect line 32 and tungsten plug 30. In another embodiment, the gas introduced liquid is dispensed onto the surface of the wafer containing the partially formed IC with interconnect line 32 and tungsten plug 30 by a nozzle.

Contact of interconnect line 32 connected to tungsten plug 30 (and tungsten plug 30 if not covered by interconnect 32) with the gas introduced liquid fully or partially discharges conductive interconnect line 32 and tungsten plug 30 connected thereto and the underlying conductive line 22 connected to tungsten plug 30. It is noted that ICs may be created with more than two levels of interconnect lines. Interconnect lines 22 and 32 in FIG. 7 are lines in two separate levels. Ideally, each time a level of interconnect lines is formed, the newly formed interconnect lines should be contacted with gas introduced liquid.

Water, whether deionized or not, is one liquid that can be used to discharge conductive interconnect line 32 and the tungsten plug 30 connected thereto and the underlying conductive line 22 connected to tungsten plug 30, it being understood that other liquids may be employed. For purposes of explanation, the present invention will be described with contacting interconnect line 32 connected to tungsten plug 30 (and tungsten plug 30 if not covered by interconnect 32) with water having a gas introduced therein, it being understood that the present invention should not be limited thereto. It should also be understood that the water need not be pure; trace elements or compounds, whether dissolved or not, may be present in the water before gas is introduced therein. Carbon dioxide is one gas that can be introduced into the liquid which can be used to discharge conductive interconnect line 32 and the tungsten plug 30 connected thereto and the underlying conductive line 22 connected to tungsten plug 30, it being understood that other gases may be employed. For purposes of explanation, the present invention will be described with carbon dioxide as the gas that is introduced into the liquid which can be used to discharge conductive interconnect line 32 and the tungsten plug 30 connected thereto and the underlying conductive line 22 connected to tungsten plug 30, it being understood that the present invention should not be limited thereto.

For purposes of explanation, the present invention will be described with contacting interconnect line 32 connected to tungsten plug 30 (and tungsten plug 30 if not covered by interconnect 32) with a liquid having a pH below neutral (i.e., pH less than 7), it being understood that the present invention should not be limited thereto. As stated above, a liquid can be made to have a pH above or below neutral by introducing gas into the liquid. Water can be made acidic, that is reduce the pH below neutral, by introducing carbon dioxide gas into it. In one embodiment, the carbon dioxide is injected under pressure into the water. After the carbon dioxide is injected, the water is brought into contact with interconnect line 32 connected to tungsten plug 30 (and tungsten plug 30 if not covered by interconnect 32). As noted above, the interconnect line 32 connected to tungsten plug 30 is contained within a partially formed IC which is located on the surface of a wafer.

It will be recognized that the present invention can be extended to processes for fabricating integrated circuits different from that shown in FIG. 7, but yet ones that experience the aforementioned problem of corrosion of conductive material. For example, other forms of integrated circuits may include additional or fewer conductive interconnect layers, a barrier layer may exist around tungsten plug 30, the plug material may be something other than tungsten, and so on.

Figure 9:
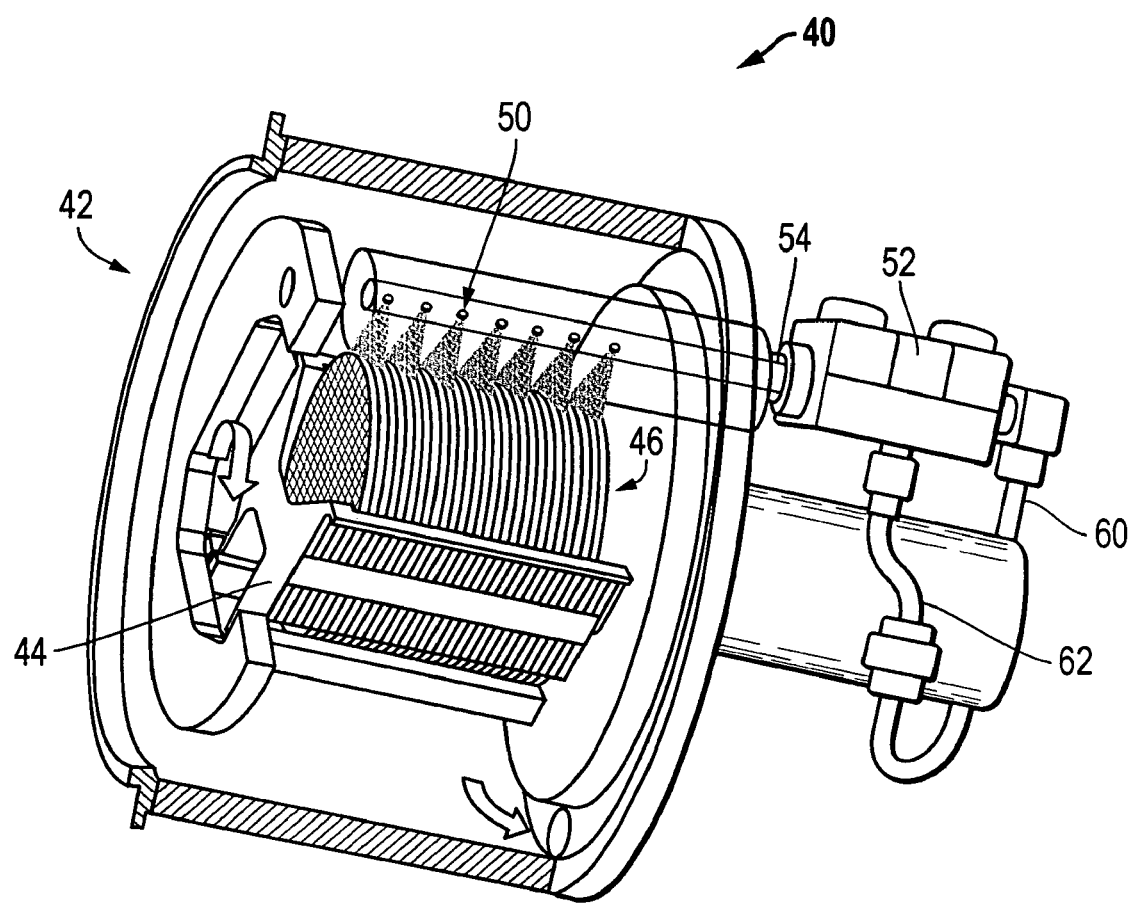
FIG. 9 illustrates a device exposing wafers, which contain ICs on their surface, to a gas introduced liquid in accordance with one embodiment of the present invention.

FIG. 9 illustrates a tool which may be employed in creating the contact between the interconnect line 32 connected to tungsten plug 30 (and tungsten plug 30 if not covered by interconnect 32) and the gas introduced liquid described in the present invention. In addition, FIG. 9 illustrates a tool which can introduce gas into the liquid described in the present invention. The tool 40 shown in FIG. 9 may be employed in a semiconductor manufacturing process line. FIG. 9 shows a process chamber 42 which holds a wafer carrier 44 containing several wafers 46. One, some, or all of the wafers contain one or more partially formed integrated circuits. Each of the partially formed integrated circuits may include the structure shown within FIG. 7. In addition, each of the partially formed integrated circuits may have charge accumulated within conductive interconnect line 32 and the tungsten plug 30 connected thereto and the underlying conductive line 22 connected to tungsten plug 30. Moreover, each of the partially formed integrated circuits may include residual polymer on interconnect line 32 that may be desired to be removed by a cleaning process, as described above. Tool 40 further includes several nozzles 50 coupled to a manifold 52 via tube 54. Manifold 52 in turn is coupled to a liquid flow line 60 and a gas flow line 62. Although not shown, liquid line 60 is coupled to a liquid source, while gas flow line 62 is coupled to a gas source. Liquid enters manifold 52 via liquid line 60 where it is mixed with gas entering via gas flow line 62. In one embodiment, the liquid is sparged in manifold 52 in that the liquid is agitated by means of compressed gas entering into the manifold 52 via gas flow line 62. The gas sparged liquid is sprayed onto wafers 46 via nozzles 50 after passing through tube 54. In one embodiment, the wafers 46 are rotated as they are sprayed with the gas sparged liquid.

In one embodiment, water, whether deionized or not, flows into manifold 52 at a rate which varies between 4 liters per minute and 14 liters per minute. In this embodiment, carbon dioxide flows into the manifold 52 at a flow rate which varies between one liter per minute and 10 liters per minute. When the carbon dioxide is mixed with the water, the pH of the water lowers. In one embodiment, the pH of the water is lowered to a pH level between 3 and 7. Using a pH meter, the pH of the carbon dioxide sparged water varies between 4.1 and 5.1 for the water and carbon dioxide flow rates set forth above. Using litmus paper, the pH of the carbon dioxide sparged water varies between 4.5 and 5.5 using the water and carbon dioxide flow rates set forth above. By using this described embodiment, charge accumulated on the conductive line 32 and the tungsten plug 30 connected thereto and the underlying conductive line 22 connected to tungsten plug 30 of the partially formed IC is partially or fully discharged when or soon after the wafers are sprayed with the carbon dioxide sparged water, thereby preventing tungsten plug 30 corrosion during residual polymer removal.

Gas can be directly introduced into the liquid before the liquid is brought into contact with interconnect line 32 connected to tungsten plug 30 (and tungsten plug 30 if not covered by interconnect 32). In another embodiment, gas such as carbon dioxide can be introduced indirectly into a liquid such as water via a membrane. For example, the manifold 52 may include two chambers separated by the membrane. Water flows into one chamber while carbon dioxide flows into the second chamber under pressure. Carbon dioxide passes through the membrane and comes in contact with the water flowing through the first chamber thereby causing carbon dioxide gas to be dissolved in the water. The water with the dissolved carbon dioxide gas can then be subsequently sprayed onto wafers in chamber 42 via nozzles 50. It has been found that the time needed to discharge interconnect line 32 can be less using water with carbon dioxide introduced indirectly therein via the membrane when compared to the time needed to discharge interconnect line 32 using water with carbon dioxide introduced therein directly.

In one embodiment, the membrane mentioned above may be porous with an average pore size of 0.05 microns to prevent particle infiltration and to control carbon dioxide movement into the water. The membrane may also be a hollow fiber membrane. NGK Filtech, LTD of Japan sells a membrane that could be used in the process of introducing carbon dioxide into water. NGK Filtech, LTD also manufactures an anti-electrostatic system named Megcon (Model number RC-1000AD, RC-1000ACD, or RC-2000ACD) that can be used for introducing carbon dioxide into water before the water is brought into contact with interconnect line 32 connected to tungsten plug 30 (and tungsten plug 30 if not covered by interconnect 32). The Megcon unit employs a manifold with two chambers separated by a membrane wherein carbon dioxide flowing into a first chamber, passes through the membrane and comes in contact with the water flowing through the second chamber thereby causing carbon dioxide gas to be dissolved in the water.

Because a gas introduced liquid may have stronger electrolytic behavior than just the liquid itself, the contact time required between the gas introduced liquid and the interconnect line 32 connected to tungsten plug 30 (and tungsten plug 30 if not covered by interconnect 32) to fully or partially electrically discharge the conductive interconnect line 32 and tungsten plug 30 connected thereto and the underlying conductive line 22 connected to tungsten plug 30 might be lower than the contact time required between a non-gas introduced liquid and the interconnect line 32 connected to tungsten plug 30 (and tungsten plug 30 if not covered by interconnect 32), resulting in shorter IC processing times.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
    forming a tungsten plug in a dielectric layer;
    forming an electrically conductive interconnect line on the dielectric layer after formation of the tungsten plug, wherein the tungsten plug is electrically connected to the electrically conductive interconnect line;
    introducing a gas into a liquid;
    discharging the tungsten plug by contacting the electrically conductive interconnect line with the gas introduced liquid after formation of the electrically conductive interconnect line;
    contacting the electrically conductive interconnect line with a solution to remove residual polymer after the electrically conductive interconnect line is contacted with the gas introduced liquid.

2. The method of claim 1 wherein the gas comprises carbon dioxide.

3. The method of claim 1 wherein the pH of the liquid is reduced by introducing the gas into it.

4. The method of claim 1 wherein the gas introduced liquid has a pH that is less than neutral.

5. The method of claim 4 wherein the pH of the gas introduced liquid is greater than 3.

6. The method of claim 1 wherein the liquid is made more electrolytic by introducing the gas into it.

7. The method of claim 1 wherein the liquid comprises water.

8. The method of claim 7 wherein the liquid is deionized before the gas is introduced into it.

9. The method of claim 1 wherein contacting the electrically conductive interconnect line with the gas introduced liquid comprises spraying the electrically conductive interconnect line with the gas introduced liquid.

10. A method comprising:
    forming a tungsten plug in a dielectric layer;
    forming an electrically conductive interconnect line on the dielectric layer after formation of the tungsten plug, wherein the tungsten plug is electrically connected to the electrically conductive interconnect line;

introducing a gas into a liquid;

discharging the tungsten plug by contacting the electrically conductive interconnect line with the gas introduced liquid after formation of the electrically conductive interconnect line;

wherein introducing the gas into the liquid further comprises:

the gas flowing into a first chamber;

the liquid flowing into a second chamber, wherein the first and second chambers are separated by a porous membrane;

the gas flowing into the first chamber passing into the second chamber via the porous membrane and dissolving into the liquid in the second chamber.

11. The method of claim 10 wherein the gas comprises carbon dioxide.

12. The method of claim 10 wherein the gas introduced liquid has a pH that is less than neutral.

13. The method of claim 12 wherein the pH of the gas introduced liquid is greater than 3.

14. The method of claim 10 wherein the liquid comprises water.

* * * * *